(12) United States Patent
Kunimatsu et al.

(10) Patent No.: US 10,534,225 B2
(45) Date of Patent: *Jan. 14, 2020

(54) LIQUID CRYSTAL DISPLAY DEVICE

(71) Applicants: Japan Display Inc., Tokyo (JP);
Panasonic Liquid Crystal Display Co., Ltd., Himeji-shi (JP)

(72) Inventors: Noboru Kunimatsu, Chiba (JP);
Chikae Matsui, Mobara (JP); Hidehiro Sonoda, Mobara (JP); Yuko Matsumoto, Onjuku (JP); Shoichi Uchino, Annaka (JP); Masaki Matsumori, Tokai (JP); Yasushi Tomioka, Mobara (JP)

(73) Assignees: Japan Display Inc., Tokyo (JP);
Panasonic Liquid Crystal Display Co., Ltd., Himeji-shi (JP)

( * ) Notice: Subject to any disclaimer, the term of this patent is extended or adjusted under 35 U.S.C. 154(b) by 227 days.

This patent is subject to a terminal disclaimer.

(21) Appl. No.: 15/696,357

(22) Filed: Sep. 6, 2017

(65) Prior Publication Data

US 2017/0363914 A1 Dec. 21, 2017

Related U.S. Application Data

(63) Continuation of application No. 14/863,100, filed on Sep. 23, 2015, now Pat. No. 9,785,013, which is a (Continued)

(30) Foreign Application Priority Data

Feb. 17, 2010 (JP) ................................ 2010-032443

(51) Int. Cl.
*C09K 19/00* (2006.01)
*G02F 1/1337* (2006.01)
(Continued)

(52) U.S. Cl.
CPC ........ *G02F 1/133723* (2013.01); *C09K 19/56* (2013.01); *G02F 1/1368* (2013.01);
(Continued)

(58) Field of Classification Search
CPC ......... G02F 1/133723; G02F 1/133788; G02F 1/13378; G02F 1/133711; G02F 1/1368;
(Continued)

(56) References Cited

U.S. PATENT DOCUMENTS 5,756,650 A 5/1998 Yoshiak et al.
7,718,234 B2 5/2010 Tomioka et al.
(Continued)

FOREIGN PATENT DOCUMENTS

JP 02-59723 A 2/1990
JP 06-324342 A 11/1994
(Continued)

*Primary Examiner* — Ruiyun Zhang
(74) *Attorney, Agent, or Firm* — Michael Best & Friedrich LLP

(57) ABSTRACT

A liquid crystal display device includes a TFT substrate having a first alignment film and an opposing substrate having a second alignment film with liquid crystals sandwiched therebetween. One of the first and second alignment films, comprises a first polyimide produced via polyamide acid ester containing cyclobutane as a precursor and a second polyimide produced via polyamide acid as a precursor. The polyamide acid has a higher polarity than that of the polyamide acid ester. The one of the first and second alignment films is responsive to photo-alignment. A first side of the one of the first and second alignment films is adjacent to the liquid crystals, and a second side thereof is closer to one of the TFT substrate and the counter substrate than the first side. The first side contains more of the first polyimide and less of the second polyimide than the second side.

15 Claims, 9 Drawing Sheets

Related U.S. Application Data continuation of application No. 14/593,354, filed on Jan. 9, 2015, now Pat. No. 9,170,458, which is a continuation of application No. 14/493,893, filed on Sep. 23, 2014, now Pat. No. 8,988,639, which is a continuation of application No. 14/167,411, filed on Jan. 29, 2014, now Pat. No. 8,854,582, which is a continuation of application No. 13/028,311, filed on Feb. 16, 2011, now Pat. No. 8,648,988.

(51) Int. Cl.
    *G02F 1/1343*      (2006.01)
    *G02F 1/1368*      (2006.01)
    *H01L 27/12*      (2006.01)
    *C09K 19/56*      (2006.01)

(52) U.S. Cl.
    CPC .. *G02F 1/133711* (2013.01); *G02F 1/133788* (2013.01); *G02F 1/134363* (2013.01); *H01L 27/1262* (2013.01); *H01L 27/1296* (2013.01); *Y10T 428/10* (2015.01); *Y10T 428/1005* (2015.01)

(58) Field of Classification Search
    CPC . G02F 1/134363; G09K 19/56; Y10T 428/10; Y10T 428/1005; Y10T 428/1018; Y10T 428/1023
    USPC ........ 428/1.1, 1.2, 1.25, 1.26; 349/123, 129, 349/130, 132, 135; 528/188, 350, 353
    See application file for complete search history.

(56) References Cited

U.S. PATENT DOCUMENTS

| | | | |
|---|---|---|---|
| 9,134,574 B2 * | 9/2015 | Kunimatsu | ....... G02F 1/133723 |
| 9,170,458 B2 * | 10/2015 | Kunimatsu | ....... G02F 1/133723 |
| 9,785,013 B2 * | 10/2017 | Kunimatsu | ....... G02F 1/133723 |
| 2003/0020843 A1 | 1/2003 | Onishi et al. | |
| 2007/0231568 A1 | 10/2007 | Kanakarajan | |
| 2008/0049180 A1 | 2/2008 | Kim | |
| 2008/0309909 A1 | 12/2008 | Yamamoto | |
| 2009/0053430 A1 | 2/2009 | Masumori et al. | |
| 2012/0057115 A1 | 3/2012 | Kunimatsu et al. | |

FOREIGN PATENT DOCUMENTS

| | | |
|---|---|---|
| JP | 10-111514 A | 4/1998 |
| JP | 2003-057147 A | 2/2003 |
| JP | 2004-206091 A | 7/2004 |
| JP | 2008-235900 A | 10/2008 |
| JP | 2008-275699 A | 11/2008 |
| JP | 2009-080301 A | 4/2009 |
| JP | 2009-175482 A | 8/2009 |
| JP | 2009-288298 A | 12/2009 |

* cited by examiner

FIG. 10

ANCHORING STRENGTH ($10^{-3} J/m^2$)

| PROCESS / FILM STRUCTURE | SIMULTANEOUS PROCESS OF UV IRRADIATION AND HEATING | HEATING PROCESS AFTER UV IRRADIATION |
|---|---|---|
| ONE-LAYER STRUCTURE | 2 | 3 |
| TWO-LAYER STRUCTURE | 1.5 | 4 |

FIG. 11

| | UV IRRADIANCE LEVEL (mJ/cm2) | SUBSEQUENT HEATING TEMPERATURE (°C) | INTERVAL BETWEEN UV IRRADIATION AND HEATING PROCESS (h) | ANCHORING STRENGTH ($10^{-3}$ J/m²) |
|---|---|---|---|---|
| CONDITION A | 2000 TO 5000 | ≧230 | ≦1 | 4.2 |
| CONDITION B | 1000 TO 7000 | ≧200 | ≦24 | 4.0 |
| CONDITION C | 500 TO 8000 | ≧150 | ≦168 | 3.5 |

LIQUID CRYSTAL DISPLAY DEVICE

CROSS-REFERENCE TO RELATED APPLICATIONS

This application is a continuation of U.S. patent application Ser. No. 14/863,100, filed on Sep. 23, 2015, which, in turn, is a continuation application of U.S. patent application Ser. No. 14/593,354 (now U.S. Pat. No. 9,170,458), filed on Jan. 9, 2015, which, in turn, is a continuation application of U.S. patent application Ser. No. 14/493,893 (now, U.S. Pat. No. 8,988,639), filed on Sep. 23, 2014, which, in turn, is a continuation application of U.S. patent application Ser. No. 14/167,411, filed on Jan. 29, 2014, (now U.S. Pat. No. 8,854,582), which, in turn, is a continuation application of U.S. patent application Ser. No. 13/028,311 (now U.S. Pat. No. 8,648,988), filed on Feb. 16, 2011, which claims the benefit of priority from Japanese Patent Application No. 2010-032443, filed on Feb. 17, 2010 in the Japanese Patent Office, the entire contents of which are incorporated herein by reference.

FIELD OF THE INVENTION

The present invention relates to a liquid crystal display device and particularly to a liquid crystal display device including a liquid crystal display panel in which alignment films are provided with the capability of liquid crystal (LC) alignment control by light irradiation.

BACKGROUND OF THE INVENTION

In a liquid crystal display (LCD) device, a TFT substrate over which pixel electrodes and thin-film transistors, inter alia, are formed in a matrix and an opposing substrate over which color filters, inter alia, are formed in positions corresponding to the pixel electrodes in the TFT substrate are placed facing each other and liquid crystals are sandwiched between the TFT substrate and the opposing substrate. An image is produced by controlling light transmissibility through liquid crystal modules pixel by pixel.

Owing to the fact that LCD devices are flat and light, they are used in an increasing wide range of applications in various fields including a large-screen display of TV and the like, mobile phones, Digital Still Camera (DSC), etc. Meanwhile, viewing angles are a problem specific to LCD devices. Viewing angles imply a phenomenon in which brightness and chromaticity change depending on when the screen is viewed squarely and when viewed from an oblique direction. An In Plane Switching (IPS) type LCD in which liquid crystal molecules are moved by applying an electric field in a horizontal direction offers superior viewing angle performance.

As an LC alignment process applied for alignment films for use in an LCD device, that is, a method for providing the alignment films with the capability of LC alignment control, rubbing is a conventionally used method. The LC alignment process by this rubbing accomplishes alignment of liquid crystals by rubbing the alignment films with a cloth. An alternative method for providing the alignment films with the capability of LC alignment control without touching the alignment films is called a photo-alignment method. Because liquid crystals in the IPS type LCD do not need to have a pretilt angle, the photo-alignment method can be applied to the IPS type LCD.

A photo-alignment process, namely, a photolytic LC alignment by irradiation of light such as, typically, ultraviolet light is disclosed in Japanese Published Unexamined Patent Application No. 2004-206091, in which the following are described about the photo-alignment process of photolytic LC alignment: (1) this process decreases the disturbance of LC alignment due to a complex level difference configuration in a pixel region; and (2) this process eliminates thin-film transistor breakdown caused by static electricity generated In the LC alignment process by rubbing and a poor-quality display caused by the disturbance of LC alignment due to pilling of the rubbing cloth or dust attached thereto and also eliminates process complexity because of frequent rubbing cloth replacement required to obtain the capability of uniform LC alignment control.

In Japanese Published Unexamined Patent Application No. 2008-235900, a two-layer alignment film structure is described, wherein an alignment film capable of photo-alignment is formed in an upper layer and an alignment film having a lower volume resistance than the upper layer is formed in a lower layer, thereby shortening the time in which an afterimage disappears. In Japanese Published Unexamined Patent Application No. 2003-57147, a method for measuring azimuthal anchoring strength which becomes a problem in photo-alignment is described.

SUMMARY OF THE INVENTION

In terms of providing the alignment films with the capability of LC alignment control, it is known that the alignment stability of the photo-alignment process is generally lower than that of the rubbing process. Low alignment stability varies an initial LC alignment direction, resulting in a poor-quality display. Especially, in an LCD device using an IPS type LCD panel for which high alignment stability is required, low alignment stability tends to give rise to a power-quality display typified by afterimages.

In the photo-alignment process, a step of stretching and straightening the main chains of polymeric molecules as in the rubbing process does not exist in the LCD process. Instead, in the photo-alignment process, an alignment film made of a synthetic polymer typified by polyimide, irradiated by polarized light, is provided with uniaxial anisotropy in a direction perpendicular to the polarization direction, resulting from that the main chains of the polymer are broken in a direction parallel to the polarization direction. Liquid crystal molecules are aligned along the orientation of long main chains that remained extending straight without being broken. If the length of the main chains is short, it results in a decrease in the uniaxial anisotropy, which in turn weakens the interaction with liquid crystals. As a result, the alignment stability decreases and the above-mentioned afterimages are liable to occur.

Therefore, in order to improve the uniaxial anisotropy and the alignment stability of an alignment film, an increase in the molecular weight of the alignment film is needed. As a solution for this, it is possible to use a photo-alignment film material obtained by imidization of polyamide acid ester. According to this solution, such polyamide acid ester material is not accompanied by a reaction of decomposition into diamine and acid anhydride during an imidization reaction, which would take place in a conventionally used polyamide acid material. Thus, the alignment film can be maintained to have a large molecular weight after imidization and its alignment stability comparable to that provided by the rubbing process can be obtained.

Because the polyamide acid ester material does not include a carboxylic acid in its chemical structure, it yields a higher voltage retention rate of LCD as compared with a polyamide acid material and can ensure an improvement in long-term reliability.

For the meantime, as for LCD devices using photo-alignment, during long time operation, the direction of initial alignment of liquid crystals will offset from that direction initially determined when the LCD device was manufactured. Due to this, afterimages arise, which are called AC afterimages. It is found that these afterimages are generated because the azimuthal anchoring strength of alignment films is weak. Hence, the AC afterimages are irreversible and unrecoverable. The azimuthal anchoring strength means the strength that provides resistance against the offset of liquid crystals in an azimuthal direction from the initial alignment direction.

Meanwhile, afterimages also arise from charge accumulation in alignment films. They are called DC afterimages. The DC afterimages are reversible and disappear over time.

A problem of the present invention is to improve the azimuthal anchoring strength of alignment films in the photo-alignment method and prevent so-called AC afterimages from arising. An object of the present invention is to prevent so-called DC afterimages from arising or to make the DC afterimages disappear quickly even if they arise.

The present invention overcomes the above-discussed problems and offers practical means as will be outlined below. Specifically, an alignment film for aligning liquid crystals is adapted to have a two-layer structure including a photo-alignment film in an upper layer adjoining liquid crystals and an alignment film with enhanced film strength in a lower layer adjoining a substrate. The upper layer photo-alignment film is formed of a precursor of polyamide acid ester containing 80% or more polyamide acid ester including cyclobutane. The lower layer alignment film with enhanced film strength is formed of a precursor of polyamide acid.

After drying and firing the alignment film thus including the two layers, the film is irradiated with polarized ultraviolet light, so that photo-alignment of the photo-alignment film is performed. Thereafter, the alignment film is finished by heating the substrate irradiated with the ultraviolet light.

The photo-alignment film is imidized at a rate of 50% or more. The photo-alignment film accounts for between 30% and 60% of the whole alignment film. The volume resistivity of the upper layer photo-alignment film is larger than that of the lower layer alignment film with enhanced film strength.

An alternative structure of the present invention is as follows: the upper layer photo-alignment film is formed of a precursor of polyamide acid containing 80% or more polyamide acid including cyclobutane, and the lower layer alignment film with enhanced film strength is formed of a precursor of polyamide acid not including cyclobutane. The fabrication process is the same as described above.

A further alternative structure of the present invention is as follows: the upper layer photo-alignment film is formed of a precursor of polyamide acid ester containing 80% or more polyamide acid ester including cyclobutane, and the lower layer alignment film with enhanced film strength is formed of a precursor of polyamide acid ester not including cyclobutane. The fabrication process is the same as described above.

According to the present invention, the alignment film has the two-layer structure including the photo-alignment film adjoining liquid crystals and the alignment film with enhanced film strength adjoining the substrate. Therefore, by way of photo-alignment, it is possible realize a liquid crystal display device in which the azimuthal anchoring strength is strong and less afterimages appear after long time operation.

According to the present invention, after photo-alignment by performed by ultraviolet light irradiation, the substrate is heated at a predetermined temperature. Therefore, it is possible to enhance the (LC) anchoring strength of the alignment film, as degrading the mechanical strength of the alignment film is avoided.

BRIEF DESCRIPTION OF THE DRAWINGS

FIG. 10 is a graph showing a relationship among alignment film structure, process for forming the alignment film, and azimuthal anchoring strength;

FIG. 11 is a graph showing a relationship between process conditions for forming a photo-alignment film and azimuthal anchoring strength;

DETAILED DESCRIPTION OF PREFERRED EMBODIMENTS

Subject matters of the present invention will be described in detail by means of the following exemplary embodiments.

First Embodiment

Figure 1:
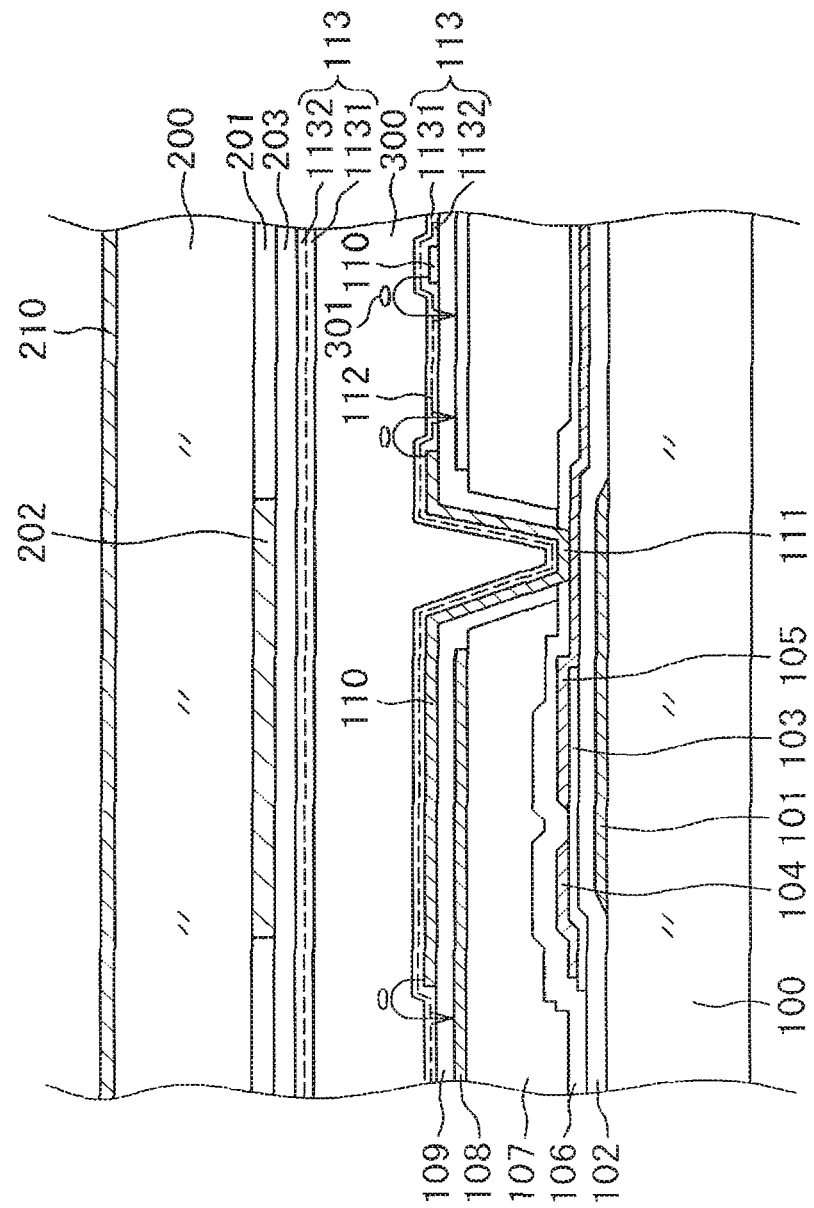
FIG. 1 is a cross-sectional diagram of an IPS type liquid crystal display device.

FIG. 1 is a cross-sectional diagram showing a structure in a display region of an IPS type liquid crystal display device. A variety of electrode structures for IPS type liquid crystal display devices are proposed and put in practical use. The structure shown in FIG. 1 is widely used now. In simple terms, over a common electrode 108 formed in a flat monolithic form, a comb-shaped pixel electrode 110 is formed with an insulation layer intervening therebetween. By rotating liquid crystals 301 depending on a voltage between the pixel electrode 110 and the common electrode 108, light transmissibility through a liquid crystal layer 300 is controlled pixel by pixel and an image is thus produced. The structure in FIG. 1 will be described in detail below. While the present invention is described by taking the structure in FIG. 1 as an example, the invention can be applied to an IPS type liquid crystal display device having a structure other than that shown in FIG. 1.

In FIG. 1, a gate electrode 101 is formed on the top of a TFT substrate 100 made of glass. The gate electrode 101 is formed in the same layer as for a scan line. The gate electrode 101 is formed of an AlNd alloy and a MoCr alloy layered over the AlNd alloy.

Agate insulation film 102 covering the gate electrode 101 is formed of SiN. On the top of the gate insulation film 102, a semiconductor layer 103 is formed of a-Si film in a position opposed to the gate electrode 101. The a-Si film is formed by plasma CVD. The a-Si film defines a channel portion of a TFT, and a source electrode 104 and a drain electrode 105 are formed over the a-Si film, sandwiching the channel portion therebetween. In addition, an n+Si layer, not shown, is formed between the a-Si film and the source electrode 104 or the drain electrode 105. The n+Si layer is formed for providing an ohmic contact between the semiconductor layer and the source electrode 104 or the drain electrode 105.

The source electrode 104 overlaps a part of an image signal line and the drain electrode 105 is connected to the pixel electrode 110. Both the source electrode 104 and the drain electrode 105 are formed together in the same layer. In the present embodiment, the source electrode 104 or the drain electrode 105 is formed of a MoCr alloy. If it is desired to decrease the electrical resistance of the source electrode 104 or the drain electrode 105, an electrode structure in which, for example, an AlNd alloy is sandwiched between MoCr alloys is used.

An inorganic passivation film 106 covering the TFT is formed of SiN. The inorganic passivation film 106 protects the TFT, particularly, its channel portion against impurities 401. Over the inorganic passivation film 106, an organic passivation film 107 is formed. Since the organic passivation film 107 protects the TFT and also acts to planarize the surface, it is formed thick. Its thickness ranges from 1 µm to 4 µm.

As the material of the organic passivation film 107, a photosensitive acryl resin, silicon resin, or polyimide resin, inter alia, is used. In the organic passivation film 107, a through hole 111 needs to be formed in a location to connect the pixel electrode 110 and the drain electrode 105. Because the organic passivation film 107 is photosensitive, the through hole 111 can be formed by exposing the organic passivation film 107 itself to light and through development without using a photoresist.

On the top of the organic passivation film 107, the common electrode 108 is formed. The common electrode 108 is formed by sputtering ITO (Indium Tin Oxide), which makes a transparent, electrically conductive film, over the display region. That is, the common electrode 108 is formed in a planar form. After forming the common electrode 108 over the surface by sputtering, the common electrode 108 is removed by etching only in the portion of the through hole 111 to provide electrical conduction between the pixel electrode 110 and the drain electrode 105.

An upper insulation film 109 covering the common electrode 108 is formed of SiN. After the upper insulation film 109 is formed, the through hole 111 is formed by etching. By etching the inorganic passivation film 106, using the upper insulation film 109 as a resist, the through hole 111 is formed. Then, an ITO film, which becomes the pixel electrode 110, covering the upper insulation film 109 and the through hole 111, is formed by sputtering the ITO. The pixel electrode 110 is formed by patterning the ITO film deposited by sputtering. The ITO film which becomes the pixel electrode 110 is also deposited on the walls of the drain hole 111. This makes electrical conduction between the drain electrode 105 extending from the TFT and the pixel electrode 110 in the through hole 111 and an image signal is thus supplied to the pixel electrode 110.

Figure 2:
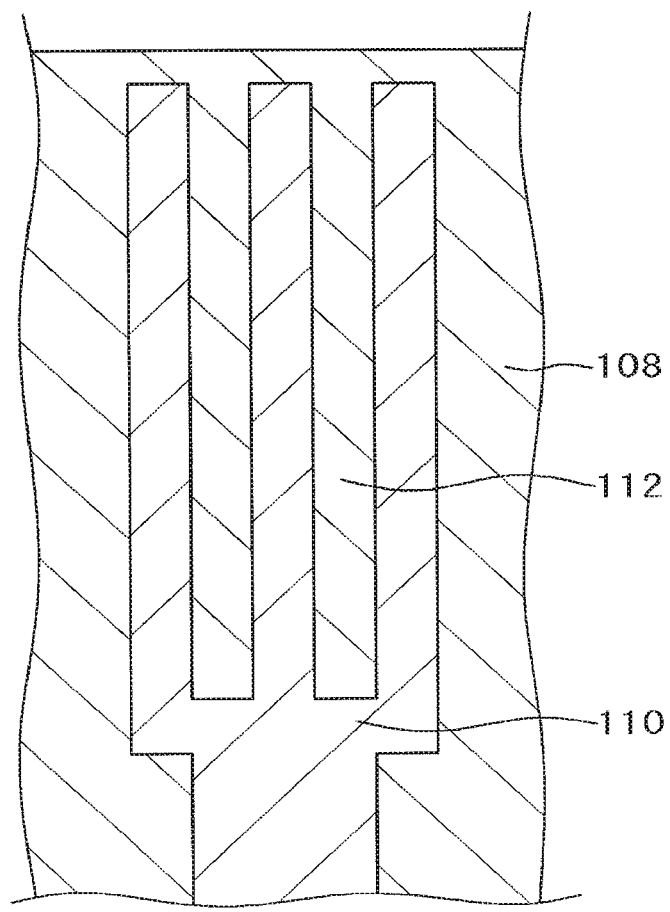
FIG. 2 is a plan view of a pixel electrode in FIG. 1.

FIG. 2 shows one example of the pixel electrode 110. The pixel electrode is a comb-shaped electrode. Slits 112 are defined between each comb teeth. The planar common electrode is formed under the pixel electrode 110. When an image signal is applied to the pixel electrode 110, liquid crystals 301 are rotated by lines of electric force generated between the pixel electrode 110 and the common electrode 108 and passing through the slits 112. Thereby, light passing through the liquid crystal layer 300 is controlled to produce an image.

FIG. 1 is also intended to explain this aspect. Gaps between each comb teeth of the comb-shaped electrode correspond to the slits 112 as shown in FIG. 1. A constant voltage is applied to the common electrode 108 and a voltage of an image signal is applied to the pixel electrode 110. When the voltage is applied to the pixel electrode 110, as shown in FIG. 1, lines of electric force are generated to rotate liquid crystals 301 in the direction of the lines of electric force and control the transmission of light from a backlight. Due to the fact that the transmission of light from the backlight is controlled pixel by pixel, an image is produced.

In the example of FIG. 1, the common electrode 108 formed in the planar form is placed on the top of the organic passivation film 107 and the comb-shaped electrode 110 is placed on the top of the upper insulation film 109. Conversely to this, however, there may be a case where a pixel electrode 110 formed in a planar form is placed on the top of the organic passivation film 107 and a comb-shaped common electrode 108 is placed on the top of the upper insulation film 109.

Over the pixel electrode 110, an alignment film 113 is formed to align the liquid crystals 301. In the present invention, the alignment film 113 has a two-layer structure including a photo-alignment film 1131 adjoining the liquid crystal layer 300 and an alignment film with enhanced film strength 1132 formed underlying the photo-alignment film 1131. The structure of the alignment film 113 will be described in detail later.

In FIG. 1, an opposing substrate 200 is placed across the liquid crystal layer 300. Inside the opposing substrate 200, color filters 201 are formed. Red, green, and blue color filters 201 are formed for each pixel to produce a color image. Between each color filter 201, a black matrix 202 is formed to improve an image contrast. The black matrix 202 also acts as a light shielding film of the TFT and prevents a photo current being flowing in the TFT.

An overcoat film 203 covering the color filters 201 and black matrixes 202 is formed. Because the surface of the color filters 201 and black matrixes 202 is uneven, the surface is planarized by the overcoat film 203.

Over the overcoat film 203, an alignment film 113 is formed to determine an initial alignment of liquid crystals. The alignment film 113 of the opposing substrate also has a two-layer structure including a photo-alignment film 1131 adjoining the liquid crystal layer 300 and an alignment film with a lower resistance 1132 formed underlying the photo-alignment film 1131. Because of IPS that is shown in FIG. 1, the common electrode 108 is formed in the TFT substrate 100, not in the opposing substrate 200.

As shown in FIG. 1, in IPS, an electrically conductive film is not formed inside the opposing electrode 200. This makes the potential of the opposing electrode 200 unstable. In addition, an external electromagnetic noise intrudes the liquid crystal layer 300 and has an influence on an image. To eliminate such a problem, a surface electrically conductive film 210 is formed over the outside of the opposing electrode 200. The surface electrically conductive film 210 is formed by sputtering ITO, which makes a transparent, electrically conductive film.

Figure 3A:
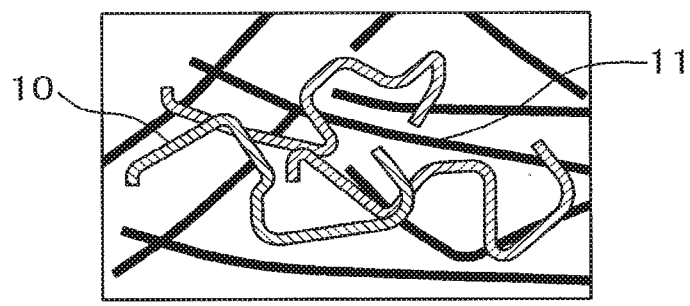
FIGS. 3A and 3B illustrate an alignment film structure according to the present invention.
Figure 3B:
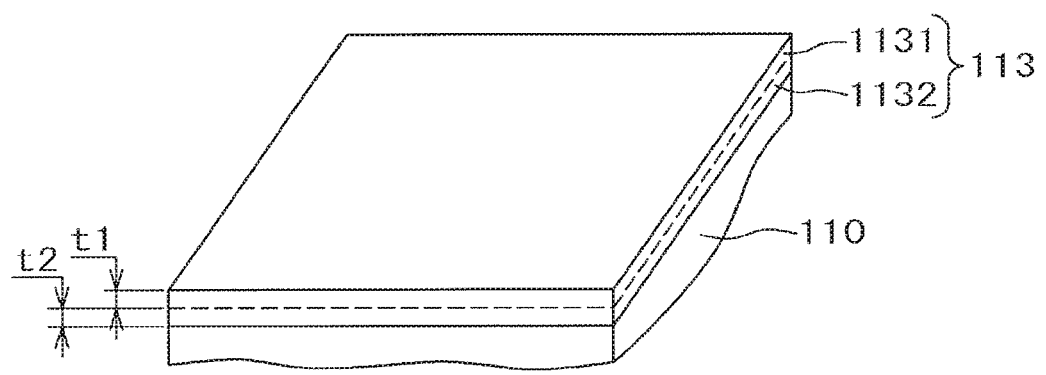

FIGS. 3A and 3B schematically illustrate an alignment film 113 according to the present invention. FIG. 3A is a transparent plane view of the alignment film 113 and FIG. 3B is a cross-sectional perspective view thereof. The alignment film 113 of the present invention has a two-layer structure including an upper photo-alignment film 1131 adjoining the liquid crystal layer and a lower alignment film with enhanced film strength 1132.

The molecular formula of polyamide acid ester is represented by chemical formula (1).

[Chemical Formula 1]

Chemical formula 1

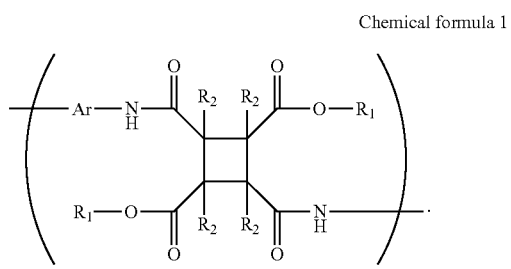

In chemical formula (1), R1 is, individually, an alkyl group having a carbon number from 1 to 8, R2 is, individually, a hydrogen atom, fluorine atom, chlorine atom, bromine atom, phenyl group, alkyl group having a carbon number from 1 to 6, alkoxy group having a carbon number from 1 to 6, vinyl group (—(CH2)m-CH=CH2, m=0, 1, 2) or acetyl group (—(CH2)m-C≡CH, m=0, 1, 2), and Ar is an aromatic compound.

Chemical formula (1) is polyamide acid ester including cyclobutane, but there is also polyamide acid ester not including cyclobutane. However, because what is capable of photo-alignment is polyamide acid ester including cyclobutane, polyamide acid ester including cyclobutane should account for 80% or more of the alignment film material.

The molecular formula of polyamide acid in FIG. 3A is represented by chemical formula (2). Chemical formula (2) is an exemplary structure of polyamide acid not including cyclobutane.

[Chemical Formula 2]

Chemical formula 2

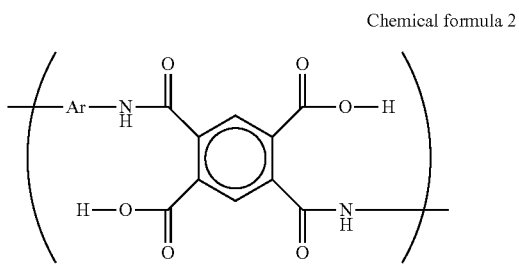

-continued

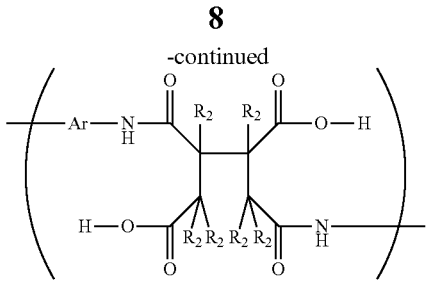

In chemical formula (2), R2 is, individually, a hydrogen atom, fluorine atom, chlorine atom, bromine atom, phenyl group, alkyl group having a carbon number from 1 to 6, alkoxy group having a carbon number from 1 to 6, vinyl group (—(CH2)m-CH=CH2, m=0, 1, 2) or acetyl group (—(CH2)m-C≡CH, m=0, 1, 2) and Ar is an aromatic compound.

Unlike chemical formula (1), chemical formula (2) does not include cyclobutane. Because the alignment film with enhanced film strength does not need to perform photo-alignment, it is unnecessary for this film to include cyclobutane. Conversely, polyamide acid represented by chemical formula (2) is not susceptible to ultraviolet light, because no cyclobutane exists in it. In addition, a difference between chemical formula (1) and chemical formula (2) lies in that R1 existing in chemical formula (1) representing polyamide acid ester is replaced by H in chemical formula (2).

Since FIG. 3A is a transparent view, a photolytic polymer 10 in the photo-alignment film and a non-photolytic polymer 11 in the alignment film with enhanced film strength are visible in a transparent fashion. In FIG. 3B, the alignment film 113 is formed over the pixel electrode 110 or organic passivation film 107 in FIG. 1. In FIG. 3B, the alignment film 113 is formed over the pixel electrode 110. The thickness t1 of the upper photo-alignment film 1131 is about 50 nm and the thickness t2 of the lower alignment film with enhanced film strength 1132 is about 50 nm. The boundary between the photo-alignment film 1131 and the alignment film with enhanced film strength 1132 is indefinite and, therefore, it is drawn by a dotted line.

Figure 4A:
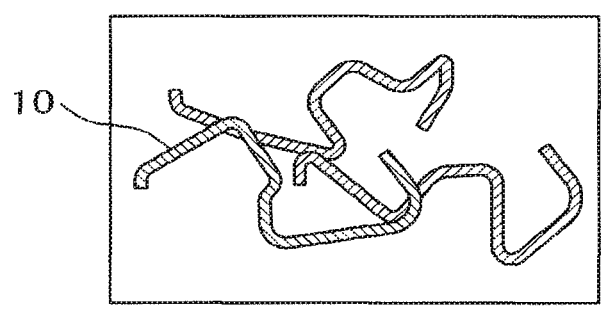
FIGS. 4A and 4B illustrate the principle of a photo-alignment film.
Figure 4B:
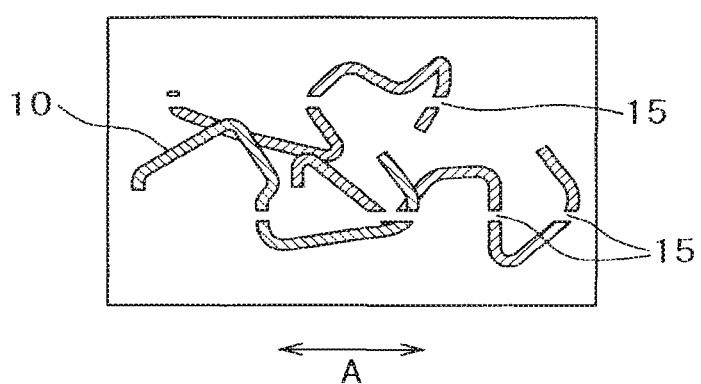

FIGS. 4A and 4B schematically illustrate the principle for aligning liquid crystals by the photo-alignment film 1131. In FIGS. 4A and 4B, the alignment film with enhanced film strength 1132 is omitted. FIG. 4A shows a state in which the photo-alignment film 1131 has been deposited. The photo-alignment film 1131 is formed of the photolytic polymer 10.

The photo-alignment film 1131 shown in FIG. 4A is irradiated with ultraviolet light polarized in a horizontal direction, e.g., at an energy of 6 J/cm$^2$. In the photo-alignment film 1131, then, the photolytic polymer 10 in the polarization direction of the polarized ultraviolet light is broken by the ultraviolet light, as is shown in FIG. 4B. That is, breaks 15 are made by the ultraviolet light along the polarization direction of the ultraviolet light. In consequence, liquid crystal modules are aligned in a direction of arrow A in FIG. 4B.

If the main chains of the photolytic polymer 10 are short, as shown in FIGS. 4A and 4B, it results in a decrease in the uniaxial anisotropy of the alignment film, which in turn weakens the interaction with liquid crystals. In consequence, the alignment performance decreases. Hence, it is desirable that the photolytic polymer 10 extends as long as possible in the direction of arrow A in FIG. 4B even after the photo-alignment. In other words, an increase in the molecular weight of the alignment film 113 is needed in order to improve the uniaxial anisotropy and the alignment stability of the alignment film 113.

The molecular weight of the alignment film 113 can be evaluated in terms of a number average molecular weight. Given that polymers with diverse molecular weights exist in the alignment film 113, the number average molecular weight is an average molecular weight among the polymers. In the photo-alignment film 1131, a number average molecular weight of 5000 or more is required to obtain sufficient alignment stability.

In order to achieve the photo-alignment film 1131 with such a large number average molecular weight, imidized polyamide acid ester can be used. The structure of polyamide acid ester is as given previously in chemical formula (1).

Polyamide acid ester is characterized by R1 in chemical formula (1). In the polyamide acid ester, R1 is $CnH2n-1$, where n is 1 or more. If the polyamide acid ester is used as a precursor of the photo-alignment film 1131, it is not accompanied by a reaction of decomposition into diamine and acid anhydride during an imidization reaction, which would take place in a conventionally used polyamide acid material. Thus, the photo-alignment film can be maintained to have a large molecular weight after imidization and its alignment stability comparable to that provided by the rubbing process can be obtained.

However, the photo-alignment film suffers from a decrease in the film strength, because the main chains are broken in a particular direction. Study efforts made by the present inventors have revealed that degradation in the azimuthal anchoring strength of an alignment film relates to the mechanical strength of the alignment film. Thus, by making the alignment film of the two-layer structure and by disposing the alignment film with enhanced film strength in the lower layer and the photo-alignment film in the upper layer, the film strength of the whole alignment film is increased, which is effective for improving the azimuthal anchoring strength of the alignment film.

Figure 5A:
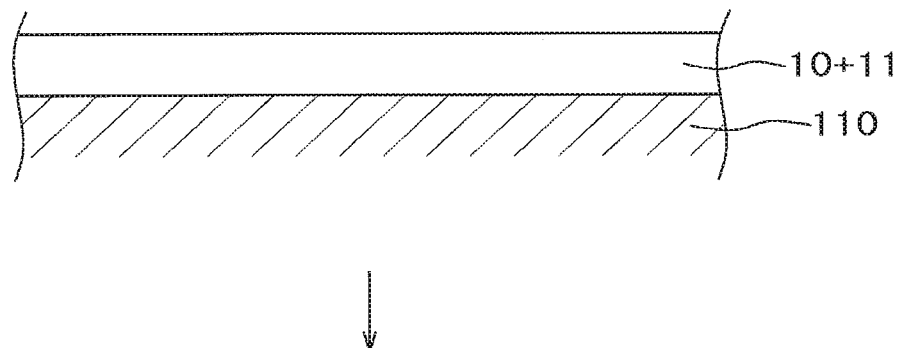
FIGS. 5A and 5B are cross-sectional diagrams of an alignment film of the present invention.
Figure 5B:
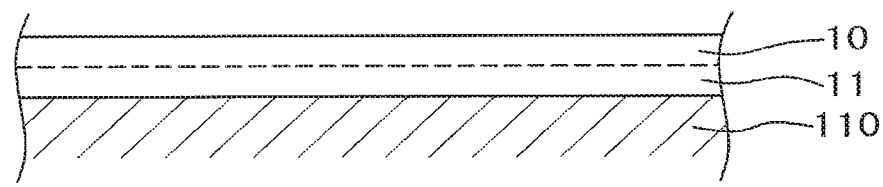

FIGS. 5A and 5B are cross-sectional diagrams to schematically illustrate a way of forming the two-layer alignment film. Forming the alignment film 113 of the two-layer structure can be accomplished without an additional process for forming the alignment film 113. That is, as shown in FIG. 5A, a mixture material of the photolytic polymer 10 and the polymer 11 for forming the alignment film with enhanced film strength is deposited onto the substrate. Then, one substance that will more readily settle on the substrate is deposited in the lower layer and the other substance is deposited in the upper layer by a leveling effect, as shown in FIG. 5B; so-called phase separation takes place.

In this embodiment for depositing the two-layer alignment film, what is called the substrate is the ITO film from which the pixel electrode 110 is formed or the organic passivation film 107. In comparison with polyamide acid ester, polyamide acid has a higher polarity (larger surface energy) and will more readily settle on the ITO film or the organic passivation film 107. Hence, polyamide acid always makes the lower layer. In the present invention, since the number average molecular weight of the alignment film with enhanced film strength formed of polyamide acid is larger than that of the photo-alignment film formed of polyamide acid ester, phase separation can take place more easily in addition to the polarity or surface energy effect. Of the two layers of alignment film, the photo-alignment film 1131 accounts for between 30% and 60% of the whole alignment film. One reason for this is disposing the photo-alignment film with a sufficient thickness in the upper layer and another reason is that phase separation is easy to take place after depositing the two-layer alignment film.

By heating the thus formed resin film at about 200° C., the alignment film is imidized. Imidization is performed for both polyamide acid 1132 in the lower layer and polyamide acid ester 1131 in the upper layer at the same time. Therefore, it is possible to form the two-layer alignment film 113 through the same process as for forming a one-layer alignment film 113.

In order to stabilize LC alignment performance, the photo-alignment film 1131 in the upper layer needs to be imidized at a high rate, as it is required to increase the photolysis efficiency of the photolytic polymer 10. This is because a photolysis reaction is hard to take place, unless the photo-alignment film is well imidized. Since polyamide acid ester is generally hard to imidize, an imidization accelerator may be added as an additive for aiding the imidization. The photo-alignment film 1131 should be imidized at a rate of 50% or more, more preferably, 70% or more. The remaining is polyamide acid ester existing as a precursor in the photo-alignment film 1131.

On the other hand, because the alignment film with enhanced film strength 1132 in the lower layer has no relation to liquid crystal alignment performance, a rate at which it should be imidized does not need to be specified particularly. That is, a condition for imidization may be set with regard to the imidization of polyamide acid ester in the upper layer.

Figure 6:
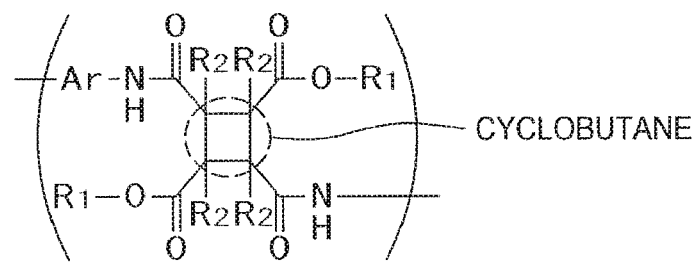
FIG. 6 is a chemical formula of polyamide acid ester including cyclobutane.

The boundary between the upper and lower layers of the alignment film is indefinite. This boundary is denoted by a dotted line in FIG. 5B. In FIG. 5B, the photo-alignment film 1131 in the upper layer is composed of polyamide acid ester; particularly, polyamide acid ester including cyclobutane, as is shown in FIG. 6, accounts for 80% or more of the whole. That is, in the polyamide acid ester, cyclobutane is decomposed by polarized ultraviolet light and this cyclobutane decomposition yields photo-alignment performance. Thus, it is requisite that the proportion of polyamide acid ester including cyclobutane is considerably large.

Figure 7:
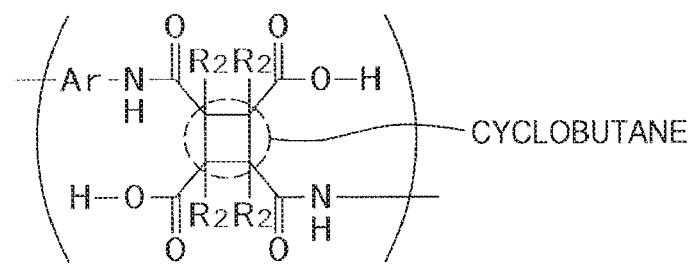
FIG. 7 is a chemical formula of polyamide acid including cyclobutane.

On the other hand, the alignment film with enhanced film strength 1132 in the lower layer is formed of polyamide acid; it is desirable that polyamide acid including cyclobutane which is shown in FIG. 7 does not exist therein. Instead, polyamide acid not including cyclobutane, as represented by chemical formula (2), is used. That is, this is because it will be expedient that the alignment film with enhanced film strength in the lower layer is not decomposed by ultraviolet light in order to maintain the mechanical strength of the alignment film as the whole even after photo-alignment.

As explained above, the two-layer alignment film is characterized in that it is formed such that the photo-alignment film 1131 in the upper layer includes a considerable amount of cyclobutane, whereas the alignment film with enhanced film strength 1132 in the lower layer does not include cyclobutane. In other words, the photo-alignment film 1131 adjoining liquid crystals includes a considerable amount of cyclobutane, whereas the alignment film with enhanced film strength 1132 adjoining the pixel electrode or organic passivation film, substantially, does not include cyclobutane.

As above, even if the upper layer is formed of polyamide acid ester including a considerable amount of cyclobutane, as a precursor of the alignment film 113, and the lower layer is formed of polyamide acid not including cyclobutane, as a precursor, the mechanical strength of the whole alignment film may degrade depending on post processing for carrying out photo-alignment.

Figure 8:
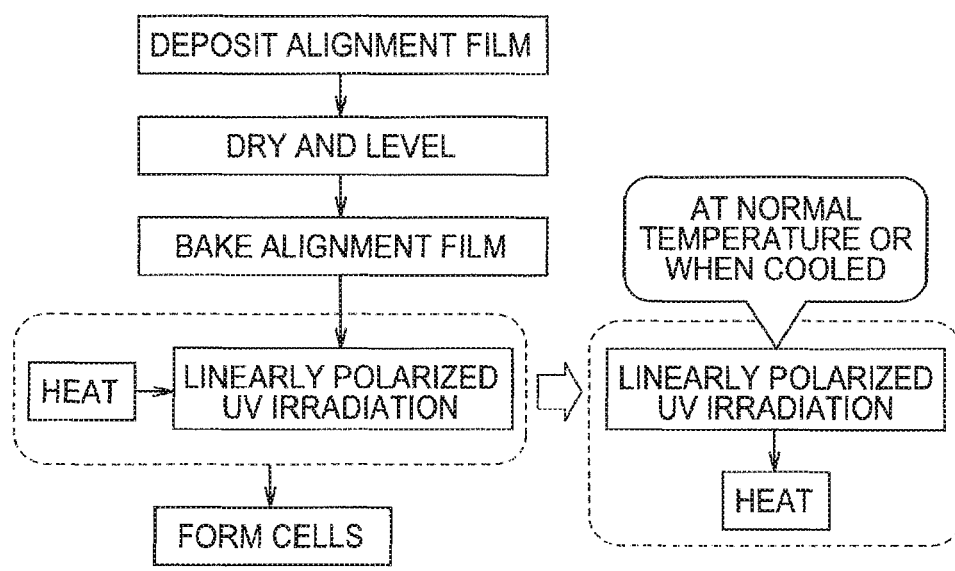
FIG. 8 is a process for forming the alignment film for photo-alignment.

FIG. 8 is a flowchart illustrating a process for photo-alignment. In FIG. 8, after depositing an alignment film, the film is dried. Until the film has been dried, the alignment film is phase-separated into two layers of the photo-alignment film 1131 and the alignment film with enhanced film strength 1132. Then, the alignment film is imidized by firing (burning) it. After that, photo-alignment is performed. Conventionally, the substrate, while being heated at about 200° C., is irradiated with linearly polarized ultraviolet light for photo-alignment. However, during ultraviolet light irradiation that is performed, while the substrate is heated, photolysis takes place by the ultraviolet light also in the lower layer alignment film with enhanced film strength and results in a decrease in the film hardness.

In contrast, the present invention adopts a process in which the substrate is irradiated with polarized ultraviolet light without being heated and, after that, the substrate is heated, as shown in a right-hand section surrounded by a dotted line in FIG. 8. By carrying out this process, the lower layer alignment film with enhanced film strength can be prevented being subjected to photolysis by the ultraviolet light and the required film strength of the alignment film as the whole can be maintained.

Figure 9:
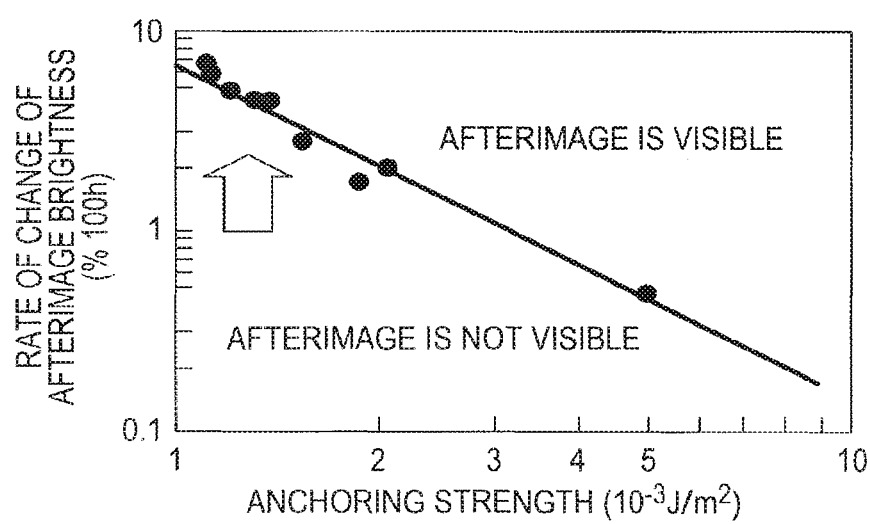
FIG. 9 is a graph showing a relationship between azimuthal anchoring strength and afterimage.
Figure 12:
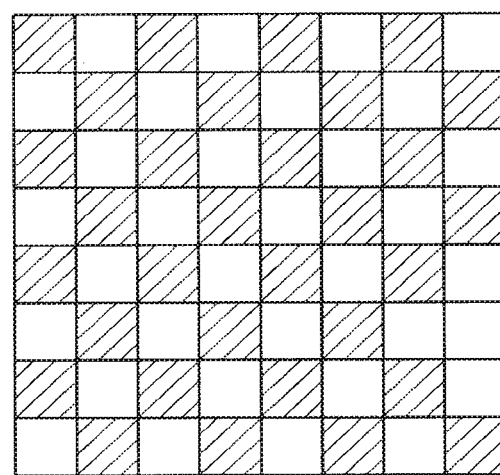
FIG. 12 shows a pattern for evaluating DC afterimages.

Owing to the structure as described above, the initial azimuthal anchoring strength of the alignment film can be improved. FIG. 9 shows a relationship between azimuthal anchoring strength and a rate of change of afterimage brightness. As for a method for measuring azimuthal anchoring strength, we used the method described in Japanese Published Unexamined Patent Application No. 2003-57147. In FIG. 9, the abscissa indicates azimuthal anchoring strength in units of $10^{-3}$ J/m$^2$ and the ordinate indicates a rate of change of afterimage brightness. A rate of change of afterimage brightness is determined as follows. For example, a checker flag pattern, as is shown in FIG. 12, is displayed for 12 hours and, then, the display returns to a gray flat halftone. A gray level of the halftone is 64/256. At this time, a brightness ratio between a light cell and a dark cell in the checker flag is a rate of change of afterimage brightness.

In FIG. 9, if a rate of change of afterimage brightness is 1% or less, afterimage may be regarded to be invisible. In FIG. 9, in order to make afterimage invisible, azimuthal anchoring strength is required to be $3.5 \times 10^{-3}$ J/m$^2$ or more.

FIG. 10 is a table showing a result of comparison of azimuthal anchoring strengths depending on alignment film structure and process for photo-alignment. In FIG. 10, the above comparison is made between the one-layer structure of alignment film, as used conventionally, and the two-layer structure of alignment film. With regard to the process for photo-alignment, the above comparison is made between the process in which substrate heating and ultraviolet light irradiation are performed at the same time and the process in which the substrate is heated after ultraviolet light irradiation.

As can be seen in FIG. 10, a condition satisfying a target value, i.e., azimuthal anchoring strength of $3.5 \times 10^{-3}$ J/m$^2$ or more, is only the case where the alignment film has the two-layer structure and the process in which the substrate is heated after ultraviolet light irradiation is used. That is, by using the present invention, it is possible to realize a liquid crystal display device that, substantially, solves an afterimage problem in the photo-alignment method.

As explained above, it is possible to obtain an alignment film in which a countermeasure against afterimages was taken by the process condition for photo-alignment. FIG. 11 is a table showing a result of evaluating process tolerance to avoid afterimages. In FIG. 11, azimuthal anchoring strengths are compared, based on the following parameters: ultraviolet light (UV) irradiance level, heating temperature after ultraviolet light irradiation, interval from ultraviolet light irradiation until substrate heating.

In FIG. 11, the parameter of ultraviolet light irradiance level is energy obtained by integrating the energies of all wavelengths from 230 to 330 nm. The ultraviolet light, particularly, polarized ultraviolet light is used. A ratio (extinction ratio) between the intensity of ultraviolet light in the polarization direction and that in the direction perpendicular to the polarization direction is not less than 15:1 in the range of the wavelengths from 230 to 330 nm.

In FIG. 11, condition A defines that the ultraviolet light irradiance level is from 2000 to 5000 mJ/cm$^2$, the heating temperature after ultraviolet light irradiation is not less than 230° C., and the interval after ultraviolet light irradiation until substrate heating is within one hour. Condition B defines that the ultraviolet light irradiance level is from 1000 to 7000 mJ/cm$^2$, the heating temperature after ultraviolet light irradiation is not less than 200° C., and the interval after ultraviolet light irradiation until substrate heating is within 24 hours. Condition C defines that the ultraviolet light irradiance level is from 500 to 8000 mJ/cm$^2$, the heating temperature after ultraviolet light irradiation is not less than 150° C., and the interval after ultraviolet light irradiation until substrate heating is within 168 hours.

In FIG. 11, condition A can provide the largest azimuthal anchoring strength, i.e., an azimuthal anchoring strength of 4.2. Next, condition B provides an azimuthal anchoring strength of 4.0 and condition C provides an azimuthal anchoring strength of 3.5. It is desirable that photo-alignment is performed according to condition A. However, photo-alignment according to condition A may be impossible because of requirements of a fabrication line. It is required to ensure particular process conditions for photo-alignment complying with at least the level of condition C or more.

In the foregoing description of the embodiment, the alignment film is discussed which uses polyamide acid ester, 80 percent or more of which is polyamide acid ester including cyclobutane, as the upper layer photo-alignment film and uses polyamide acid not including cyclobutane as the lower layer alignment film with enhanced film strength. However, the present invention is not so limited. Even with an alignment film which uses polyamide acid ester, 80 percent or more of which is polyamide acid ester including cyclobutane, in the upper layer and uses polyamide acid ester not including cyclobutane in the lower layer, it is possible to achieve the desired effect by heating the substrate after ultraviolet light irradiation as the process for photo-alignment.

Moreover, even with an alignment film which uses polyamide acid, 80 percent or more of which is polyamide acid including cyclobutane, in the upper layer and uses polyamide acid not including cyclobutane in the lower layer, it is possible to achieve the desired effect by heating the substrate after ultraviolet light irradiation as the process for photo-alignment.

Second Embodiment

In the first embodiment, how the alignment film structure and the process for photo-alignment contribute to an advantageous effect against AC afterimages is mainly discussed. The structure of the present invention can achieve the effect against so-called DC afterimages, besides AC afterimages.

DC afterimages are a phenomenon resulting from charge accumulation in certain portions of the alignment film. Hence, DC afterimages are a reversible phenomenon, because they disappear when charges dissipate. In order to avoid DC afterimages, it is conceivable that the alignment film is adapted to have a structure that facilitates fast dissipation of charges accumulated in the alignment film or a structure that primarily prevents charges from being accumulated in the alignment film.

First, descriptions are provided for the structure that facilitates fast dissipation of accumulated charges. We evaluated DC afterimages as follows. That is, the checker flag pattern made up of 8×8 white and black cells, as shown in FIG. 12, is displayed for 12 hours and, then, the display returns to a gray flat halftone. A gray level of the halftone is 64/256. At 10 minutes after the return to the halftone, if the checker flag pattern can be recognized, the test result is FAIL; if the pattern cannot be recognized, the test result is PASS.

As described in the first embodiment, the alignment film of the present invention includes the upper layer photo-alignment film and the lower layer alignment film with enhanced film strength. In the second embodiment, the alignment film with enhanced film strength is adapted to have a volume resistance of $10^{14}$ Ωcm or less, preferable, $10^{13}$ Ωcm or less. That is, this volume resistance is made smaller by one digit than the volume resistance of the upper layer photo-alignment film. This volume resistance may be that obtained when the alignment film is irradiated with light from the backlight. Thereby, charges charged in the alignment film are discharged soon.

Figure 13:
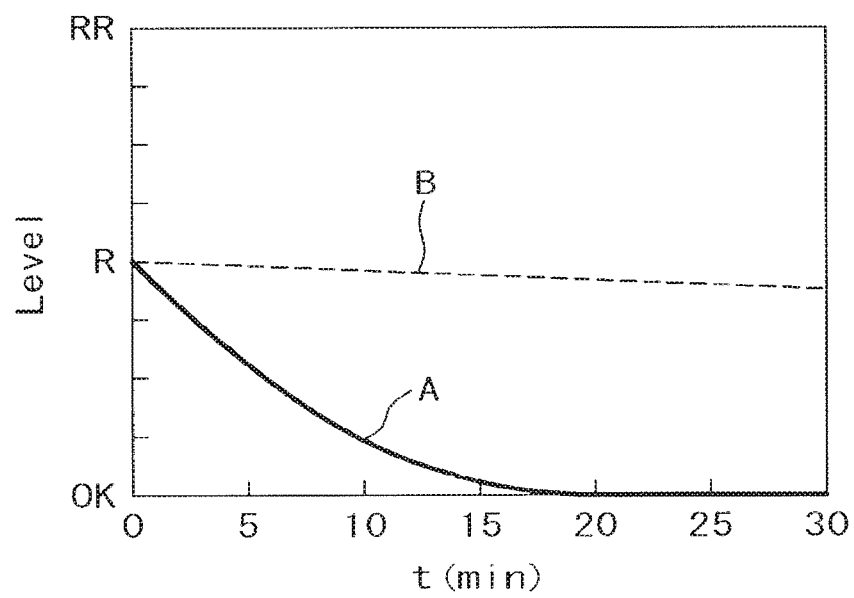
FIG. 13 shows a result of DC afterimage evaluation.

FIG. 13 shows a evaluation result from comparing DC afterimages for the alignment film of the two-layer structure as above and for a conventional one-layer alignment film. In FIG. 13, the abscissa indicates time elapsed after the return to the gray flat halftone and the ordinate indicates an afterimage level. On the ordinate, RR indicates a state that the checker flag pattern is visible well at the return to the halftone, which is FAIL. R indicates a state that the checker flag pattern is visible, but vaguely at the return to the halftone.

In FIG. 13, curve A is a DC afterimage characteristic when the alignment film according to the present invention is used. Curve B is an example of a DC afterimage characteristic when a single layer photo-alignment film is only used as the alignment film.

Even though the afterimage level is R at the return to the halftone, if the afterimage disappears in a short time, it can be considered to be practically no program. In the case of the single layer photo-alignment film, the level R at the return to the halftone persists long and, practically, a problem remains. On the other hand, for the alignment film 113 of the two-layer structure according to the present invention, DC afterimage rapidly attenuates and completely disappears at about 17 minutes after the return to the halftone.

As explained above, a large difference between the single layer photo-alignment film and the photo-alignment film of the present invention is that DC afterimage persists long in the case of the single layer photo-alignment film, whereas DC afterimage rapidly attenuates through the use of the alignment film of the present invention. In FIG. 13, according to the present invention, DC afterimage becomes 25% or less at 10 minutes after the return to the halftone, whereas DC afterimage is 90% or more at the corresponding time in the case of the single layer photo-alignment film.

An alternative method as a countermeasure against DC afterimages is to adapt the alignment film to have a structure that prevents charges from being accumulated in the alignment film, even if a certain pattern is displayed for a long time. This can be accomplished by increasing the volume resistance of the alignment film extremely. In order to accomplish this, in the present invention, the alignment film of the two-layer structure is used, wherein the photo-alignment film is formed in the upper layer and the alignment film with enhanced film strength is formed in the lower layer. In this structure, the volume resistivity of the lower layer is made larger than that of the upper layer. The upper layer photo-alignment film has a small degree of freedom in varying its volume resistance, restricted by its photo-alignment performance. On the other hand, the lower layer alignment film with enhanced film strength can have a large degree of freedom in varying its volume resistance.

If the volume resistance of the alignment film with enhanced film strength is made larger than $10^{15}$ Ωcm, the electrical resistance of the alignment film as the whole becomes larger, thereby impeding charges from being accumulated in the alignment film and the passivation film. Since the volume resistance of polyamide acid ester as the photo-alignment film is as large as about $10^{15}$ Ωcm, by making the volume resistance of the lower layer alignment film with enhanced film strength larger than $10^{15}$ Ωcm, charges are further impeded from being accumulated in the alignment film.

The structure of the two-layer alignment film described in the first and second embodiments is digested as below. In the structure including the photo-alignment film in the upper layer and the alignment film with enhanced film strength in the lower layer, polyamide acid ester is used in the upper layer and polyamide acid is used in the lower layer, wherein the upper layer contains 80% or more polyamide acid ester including cyclobutane. The upper layer is imidized at a rate of 50% or more. In the structure as above, the volume resistivity of the lower layer is made smaller than that of the upper layer in order to reduce DC afterimages.

As an example of another structure of the two-layer alignment film, polyamide acid is used in the upper layer and polyamide acid is used in the lower layer, wherein the upper layer contains 80% or more polyamide acid including cyclobutane. The upper layer is imidized at a rate of 50% or more. In the structure as above, the volume resistivity of the lower layer is made smaller than that of the upper layer in order to reduce DC afterimages.

As an example of yet another structure of the two-layer alignment film, polyamide acid ester is used in the upper layer and polyamide acid ester is used in the lower layer, wherein the upper layer contains 80% or more polyamide acid including cyclobutane. The upper layer is imidized at a rate of 50% or more. In the structure as above, the volume resistivity of the lower layer is made larger than that of the upper layer in order to prevent DC afterimages.

While the foregoing description concerns the alignment film 113 in the TFT substrate 100, the same holds true for the alignment film 113 in the opposing substrate 200. The alignment film 113 in the opposing substrate 200 is formed over the overcoat film 203. In this case also, the non-photolytic polymer 11 from which the alignment film with enhanced film strength 1132 is formed will more readily settle on the overcoat film 203. Consequently, the alignment film with enhanced film strength 1132 is formed contiguous to the overcoat film 203 and the photo-alignment film 1131 is formed on the top of the lower layer alignment film. Moreover, because the number average molecular weight of the alignment film with enhanced film strength is larger than that of the photo-alignment film, phase separation is easier to take place.

The invention claimed is:

1. A liquid crystal display device comprising:
   a TFT substrate in which a first alignment film is formed on a plurality of pixel electrodes, a common electrode, an image signal line, an organic passivation film, an inorganic passivation film, and a plurality of TFTs;
   an opposing substrate which faces the TFT substrate and in which an alignment film is formed,
   liquid crystals sandwiched between the first alignment film of the TFT substrate and the alignment film of the opposing substrate;
   wherein the organic passivation film is formed on the image signal line and the TFT,
   wherein the common electrode is formed between the organic passivation film and the inorganic passivation film, the common electrode covers the image signal line in a plan view,
   wherein the plurality of pixel electrodes is formed between the inorganic passivation film and the first alignment film,
   wherein the plurality of pixel electrodes electrically connect with the plurality of TFTs,
   wherein the pixel electrode has a first portion and a second portion adjacent to the first portion via a slit,
   wherein the thickness of the organic passivation film is thicker than the thickness of the inorganic passivation film,
   wherein the first alignment film comprises a first polyimide produced by a first compound containing cyclobutane structure as a precursor and a second polyimide produced by a second compound as a precursor,
   the second compound has higher polarity than that of the first compound,
   the first alignment film is a photo-alignment film,
   a first side of the first alignment film is adjacent to the liquid crystals, a second side of the first alignment film is closer to the TFT substrate than the first side,
   wherein the first side contains more the first polyimide than the second side contains, the second side contains more the second polyimide than the first side contains.

2. The liquid crystal display device according to claim 1, wherein a volume resistivity of the second side is lower than a volume resistivity of the first side.

3. The liquid crystal display device according claim 1, wherein
   a film hardness of the second side is bigger than that of the first side.

4. The liquid crystal display device according to claim 1, wherein
   the second compound does not contain cyclobutane structure.

5. The liquid crystal display device according to claim 1, wherein
   an imidization rate of the first compound of the first side is 50% or more.

6. The liquid crystal display device according to claim 1, wherein
   the first alignment film contacts with an Indium Tin Oxide or an organic passivation film of the TFT substrate or the counter substrate.

7. The liquid crystal display device according to claim 1, wherein the common electrode is formed in a planer shape.

8. A liquid crystal display device comprising:
   a TFT substrate in which an alignment film is formed on a pixel including a pixel electrode and a TFT;
   an opposing substrate which faces the TFT substrate and in which an alignment film is formed,
   liquid crystals sandwiched between the alignment film of the TFT substrate and the alignment film of the opposing substrate;
   wherein a first alignment film, either one of the alignment film of the TFT substrate and the alignment film of the opposing substrate, comprises a first polyimide produced by first compound containing cyclobutane structure as a precursor and a second polyimide produced by a second compound as a precursor,
   the first alignment film is a photo-alignment film,
   a first side of the first alignment film is adjacent to the liquid crystals, a second side of the first alignment film is closer to one of the TFT substrate and the counter substrate than the first side,
   a volume resistivity of the second side is larger than a volume resistivity of the first side, and
   the first side contains more the first polyimide than the second side contains, the second side contains more the second polyimide than the first side contains.

9. The liquid crystal display device according to claim 8, wherein
   a film hardness of the second side is bigger than that of the first side.

10. The liquid crystal display device according to claim 8, wherein
    the second compound does not include cyclobutane.

11. The liquid crystal display device according to claim 8, wherein
    an imidization rate of the first compound of the first side is 50% or more.

12. The liquid crystal display device according to claim 8, wherein
    the first alignment film contacts with a Indium Tin Oxide or an organic passivation film of the TFT substrate of the counter substrate.

13. The liquid crystal display device according to claim 8, wherein
    the liquid crystal display device is an IPS type liquid crystal display device.

14. The liquid crystal display device according to claim 8, wherein the TFT substrate further comprises a plurality of pixel electrode, a common electrode, an image signal line, an organic passivation film, an inorganic passivation film, and a plurality of TFTs,
    wherein the first alignment film is formed on the TFT substrate,
    wherein the organic passivation film is formed on the image signal line and the TFT,
    wherein the common electrode is formed between the organic passivation film and the inorganic passivation film, the common electrode covers the image signal line in a plan view,
    wherein the plurality of pixel electrodes is formed between the inorganic passivation film and the first alignment film,
    wherein the plurality of pixel electrodes electrically connect with the plurality of TFTs through openings formed in the organic passivation film and the common electrode,
    wherein the pixel electrode has a first portion and a second portion adjacent to the first portion via a slit, wherein the thickness of the organic passivation film is thicker than the thickness of the inorganic passivation film.

15. The liquid crystal display device according to claim 8, wherein the common electrode is formed in a planer shape.

* * * * *